United States Patent
Niclass et al.

(10) Patent No.: US 7,262,402 B2
(45) Date of Patent: Aug. 28, 2007

(54) INTEGRATED IMAGER CIRCUIT COMPRISING A MONOLITHIC ARRAY OF SINGLE PHOTON AVALANCHE DIODES

(75) Inventors: Cristiano Niclass, Clarens (CH); Edoardo Charbon, Echandens (CH); Pierre-Andre Besse, Ecublens (CH); Alexis Rochas, Frangy (FR)

(73) Assignee: Ecole Polytechnique Federal de Lausanne, Lausanne (CH)

( * ) Notice: Subject to any disclaimer, the term of this patent is extended or adjusted under 35 U.S.C. 154(b) by 0 days.

(21) Appl. No.: 11/353,229

(22) Filed: Feb. 14, 2006

(65) Prior Publication Data
US 2006/0192086 A1    Aug. 31, 2006

Related U.S. Application Data

(60) Provisional application No. 60/652,010, filed on Feb. 14, 2005.

(51) Int. Cl.
*H01L 31/00* (2006.01)
*H01L 27/00* (2006.01)

(52) U.S. Cl. .............. 250/214.1; 250/214 R; 250/208.1; 356/4.01; 356/5.01

(58) Field of Classification Search .......... 250/208.1, 250/214 R, 214.1; 356/4.01, 5.01
See application file for complete search history.

(56) References Cited

U.S. PATENT DOCUMENTS

| | | | |
|---|---|---|---|
| 5,892,575 | A | 4/1999 | Marino |
| 6,376,321 | B1 | 4/2002 | Popovic et al. |
| 6,741,341 | B2 * | 5/2004 | DeFlumere ............ 356/141.1 |
| 6,927,889 | B2 * | 8/2005 | Schwarte .................. 359/237 |
| 7,012,738 | B1 * | 3/2006 | Schwarte .................. 359/325 |

2005/0012033 A1 *  1/2005  Stern et al. ............ 250/214 R

FOREIGN PATENT DOCUMENTS

EP      1191598      3/2002

OTHER PUBLICATIONS

J. C. Jackson, et al. "Characterization of Large Area SPAD Detectors Operated in Avalanche Photodiode Mode", 13th Annual Meeting, IEEE, vol. 1, Nov. 13-16, 2000, pp. 17-18.*

Marius A. Albota, et al. "Three-Dimensional Imaging Laser Radar with a Photon-Counting Avalanche Photodiode Array and Microchip Laser", Applied Optics, vol. 41, No. 36, Dec. 20, 2002, pp. 7671-7678.*

Brian Aull, et al. "Three-Dimensional Imaging with Arrays of Geiger-Mode Avalanche Photodiodes", Proceedings of SPIE, vol. 5353, 2004, pp. 105-116.*

(Continued)

*Primary Examiner*—Georgia Epps
*Assistant Examiner*—Davienne Monbleau
(74) *Attorney, Agent, or Firm*—Blank Rome LLP

(57) ABSTRACT

An integrated imager circuit having a monolithic array of single photon avalanche diodes (SPADs) for capturing an image of a scene when said scene is hit by an optical pulse. The array has a plurality of SPADs connected to 2D readout circuits which determines the intensity of the light reflected by the scene by counting the number of photons received by the SPADs during a period of time. A plurality of SPADs connected to 3D readout circuits determines the distance to the scene by determining the elapsed time between the emission of each pulse and reception of the corresponding reflected photons.

17 Claims, 5 Drawing Sheets

OTHER PUBLICATIONS

F. Zappa, et al. "Monolithic CMOS Detector Module for Photon Counting and Picosecond Timing", IEEE, Sep. 2004, pp. 341-344.*

Rochas et al., First Passively-Quenched Single Photon Counting Avalanche Photodiode Element Integrated in a Conventional CMOS Process with 32ns Dead Time, Proceedings of the SPIE, 4833, No. 22, 9 pages, 2002.

Niclass et al., A CMOS Single Photon Avalanche Diode Array for 3D Imaging, ISSCC, 2004, Session 6, Imaging, 6.7, 2004, 10 pages.

Rochas et al., First Fully Integrated 2-D Array of Single-Photon Detectors in Standard CMOS Technology, IEEE Photonics Technology Letters, Jul. 2003, pp. 963-965, vol. 15, No. 7.

Rochas et al., Single Photon Detector Fabricated in a Complementary Metal-Oxide-Semiconductor High-Voltage Technology, Review of Scientific Instruments, Jul. 2003, pp. 3263-3270, vol. 74, No. 7.

Aull et al., Geiger-Mode Avalanche Photodiodes for Three-Dimensional Imaging, Lincoln Laboratory Journal, 2002, pp. 335-350, vol. 13, No. 2.

Edwin P. Walker et al., "Two-photon Volumetric Optical Disk Storage Systems Experimental Results and Potentials" Call/Recall, Inc., 3 pages.

Yi Zang et al., "Numerical Aperture Influence on 3-D Multi-layer Optical Data Storage Systems" Call/Recall, Inc. and Genoptix Inc, 3 pages.

Edwin P. Walker et al., 3-D Parallel Readout in a 3-D Multi-layer Optical Data Storage System, Call/Recall, Inc. Genoptix, Inc. and Emcore Fiber Optics Components, 3 pages.

Jyh-Shin Pan et al., "A CMOS Multi-Format Read/WritesoC for 7x Blu-ray/16x DVD/56x CD" ISSCC 2005, Session 31, Mass Storage 31.3, pp. 572-573 and 618.

C. Niclass et al., "Design and Characterization of a CMOS 3-D Image Sensor Based on Single Photon Avalanche Diodes", IEEE Journal of Solid-State Circuits, pp. 1847-1854, Sep. 2005.

* cited by examiner

INTEGRATED IMAGER CIRCUIT COMPRISING A MONOLITHIC ARRAY OF SINGLE PHOTON AVALANCHE DIODES

The present application claims priority of U.S. provisional patent 60/652,010, filed on Feb. 14, 2005.

The present application also incorporates by reference the content of U.S. utility patent application U.S. Ser. No. 11/290,831, filed on Dec. 1, 2005, and of U.S. provisional patent application U.S. 60/652,010, filed on Feb. 14, 2005.

FIELD OF THE INVENTION

The present invention concerns an integrated imager circuit comprising a monolithic array of single photon avalanche diodes, and an imaging system using such a circuit for reconstructing the brightness and/or the depth map of an arbitrary scene.

DESCRIPTION OF RELATED ART

A number of new and potentially high volume applications require fast and precise depth map evaluation. These applications include face recognition systems, virtual keyboards, object and person monitoring, land and sea surveyors, virtual reality games, non-ionising medical tomographic imagers, stage and choreography analysis tools, etc. Speed, compactness and especially cost concerns prompt the emergence of a new generation of solid-state imagers.

Three main techniques have been proposed: triangulation, interferometry, and time-of-flight (TOF). In triangulation systems, distance to a precise point in the scene is derived from the angle of incidence of a known point source and the angle of reflected light. The main disadvantages of such systems are the speed requirement on the sensor (usually a conventional CMOS or CCD camera), power dissipation, and a somewhat limited precision. Interferometry is being used for the high levels of accuracy it ensures. However, interferometers are usually bulky and very expensive. Furthermore, the specification on the optical components generally leads to laboratory-style optical tables.

Two variants of TOF methods may be used: those based on modulated and those based on pulsed laser sources. Modulation type TOF range finders measure the phase difference between a modulated laser source and the reflected wave. High modulation frequencies in conjunction with homodyne phase discrimination and averaging at the pixel level can be used to relax circuit specifications. However, relatively powerful laser or LED sources are still required and accuracy is limited by the speed at which the sensor can be clocked.

In pulsed type TOF, the round-trip time of a single burst of light is measured. The main advantage of this method over modulated type TOF is that a range of operations of a few meters to several kilometers can be achieved without the use of different modulation frequencies.

In pulsed type TOF, sub-millimetric resolutions require (a) sub-picosecond time discrimination capability, (b) high detection speed and/or (c) low ray divergence. If conventional detectors were to be used, time discrimination could only be achieved through highly sophisticated detectors and/or very powerful laser sources.

U.S. Pat. No. 5,892,575 describes a tri-dimensional array of sensors comprising means for determining the time-of-flight of photons, thus allowing a measure of the distance between the sensor and the scene. Each sensor comprises an avalanche photodiode. The sensor is not CMOS compatible and necessitates a complex technology, expensive and hard to integrate on a monolithic chip.

The article of B. F. Aull et al "Geiger-Mode Avalanche Photodiodes for Three Dimensional Imaging", published in the Lincoln Laboratory Journal, Vol. 12, N°2, 2202, pp. 335-350, describe another non-CMOS circuit that requires a first, non CMOS array of diodes operating in Geiger mode and a second CMOS circuit for the time discriminators. Usage of two different chips, and wire-bonding of the chips, makes the fabrication of very high resolution chip expensive. Multiple technologies could be combined on a single chip; however this is also an expensive proposition.

Moreover, prior art tri-dimensional imaging circuits based on diodes operating in Geiger-mode only deliver a monochromatic depth map for indicating the distance between the circuit and each point of the scene. Lack of information regarding the brightness or color of the scene limits the value of those circuits.

The article of A. Rochas et al. "Single photon detector fabricated in a complementary metal-oxide-semiconductor high voltage technology", Review of Scientific Instruments, Vol. 74, Nr 7, July 2003, pp. 3263-3270, describes a single photon detector based on CMOS SPAD, and proposes a generalization to two-dimensional arrays, which remained to be investigated. This document does not however relate to 2D or 3D imagers based on SPADs.

The article of A. Rochas et al., "First Fully Integrated 2-D Array of Single-Photon Detectors in Standard CMOS Technology", IEEE Photonics Technology Letters, Vol. 15, Nr 7, July 2003, pp. 963-965, describes a two-dimensional array of CMOS SPADs for fluorescence lifetime measurement and fluorescence correlation spectroscopy. This document does not relate to integrated 2D or 3D imagers, and requires a multiplexing part outside of the array of SPADs for selection of the active SPAD at each moment. The multiplexer requires the same number of outputs as the number of SPADs in the array; moreover, one dedicated line must be provided between each SPAD and the multiplexer. This solution is thus hardly scalable and poorly adapted to arrays comprising tens or even hundreds of SPADs, as required by modern imagers.

A 8×4 array of SPADs integrated in a conventional CMOS technology is presented in the article by the inventors C. Niclass, A. Rochas, P. A. Besse, and E. Charbon, "A CMOS Single Photon Avalanche Diode Array for 3D Imaging", Proc. IEEE ISSCC, pp. 120-121, Feb. 14, 2004. Although this document does suggest to use the sensor in 2D mode, it does not disclose which parameters of the scene are captured in 2D mode, and does not adequately describe any 2D or 3D readout circuit in the manner necessary for one to design or manufacture the circuit.

Therefore, it is an aim of the present invention to propose a new integrated imager circuit that overcomes the drawbacks of the prior art. In particular, an aim of the present invention is to propose an imager circuit that delivers a depth map with added value information.

BRIEF SUMMARY OF THE INVENTION

According to the invention, these aims are achieved by means of an integrated imager circuit comprising a monolithic array of single photon avalanche diodes (SPADs) for capturing an image of a scene when said scene is hit by an optical pulse, said array comprising:

a plurality of SPADs connected to 2D readout circuits to determine the intensity of the light reflected by said scene by counting the number of photons received by said SPADs during a period of time or by measuring the time intervals between successive pulses, a plurality of SPADs connected to 3D readout circuits to determine the distance to said scene by determining the elapsed time between the emission of each pulse and reception of the corresponding reflected photons.

This has the advantage that a single circuit can be used for capturing 2D and 3D data, i.e. brightness and depth. Furthermore, as SPADs operating in 2D and 3D mode are both available on the circuit, brightness and depth measurement can be performed simultaneously, using light from the same light pulse.

The readouts circuits are preferably at least partially integrated on the same chip, thus providing a compact, inexpensive imaging 2D and 3D circuit.

To reach millimetric accuracies, an array of highly sensitive, ultra-low jitter CMOS detectors capable of detecting a single photon are preferably used. The scene may be illuminated by using a cone of low power pulsed laser light, thus no mechanical scanning devices or expensive optical equipment is required.

In a preferred embodiment, the SPADs are CMOS-implemented and operated in the Geiger mode. CMOS implementation allows for an inexpensive integration and better scalability.

The 2D readout circuits preferably comprise digital counters for counting the number of pulses generated at the output of the SPADs during a predetermined period of time. The digital counters are preferably integrated in the circuit.

The 3D readout circuits preferably comprise time-to-digital converters (TDC), preferably integrated in the circuit.

In a preferred embodiment, the circuit comprises a plurality of mutually adjacent SPADs connected to 2D readout circuits and several non adjacent SPADs connected to 3D readout circuits spread into said array. The circuit may for example comprise several rows of adjacent SPADs operating in 2D mode for determining brightness, and a few single solitary 3D operated SPADs spread within the array. The 2D brightness map thus has a different, preferably higher, resolution than the 3D depth map captured by the circuit.

In another embodiment, the circuit comprises at least one SPAD connected to a 2D and 3D readout circuit arranged so as to determine both the intensity of light reflected by a scene and the distance to said scene.

The circuit may be used as part of an imaging system that also includes data processing means for computing a representation of the scene captured by said circuit, whereas the representation depends both on the intensity of the light reflected by different portions of the scene and on the distance between said circuit and other portions of the scene. The system may also, or alternatively, comprises an optical system on the optical path between said circuit and said scene. The control of focus by the optical system may then depend on said 3D readout circuit.

The present invention also concerns a monolithic integrated circuit comprising an array of CMOS implemented single photon avalanche diodes (SPADs). At least some SPADs comprise a p/n junction, for example a p+/n junction, where avalanche takes place, as well as means, for example a guard ring junction, around said SPAD for preventing edge breakdown. At least some SPADs are associated with a circuit, for example a comparator or an inverter, that transforms the Geiger voltage pulse at the output of the SPAD into a digital signal.

In an embodiment, the solid-state 3D imager circuit of the invention is based on the pulsed type TOF (time of flight) method. The sensor, implemented in standard CMOS technology, consists of an array of single photon avalanche diodes (SPADs), capable of performing a great amount, such as 1024 or more, of independent distance measurements, and an external or integrated low-cost CMOS time discriminator (for example TDCs). The scene is illuminated using a single intentionally uncollimated laser beam to create a cone of light that synchronously reaches every point of the surface. This technique eliminates the need for a mechanical device to scan the entire scene. Moreover, due to the sensor's high sensitivity, inexpensive laser sources with milliwatt peak power can be used for ranges up to several meters.

A time precision of a few tens of picoseconds is made possible by the jitter properties of SPADs when operating in Geiger mode. A 3D camera system of the invention is capable of characterizing the optical field by mapping both the depth of the scene as well as the intensity of the light reflected by it. Extremely tight speed and accuracy specifications are met, while keeping power dissipation to a minimum thanks to the inherent simplicity of the sensor design. Moreover, due to the reduced power of the laser source, it is possible to guarantee strict eye safety operation of the system even with a duty cycle of 100%.

The present invention also concerns a method for capturing an image of a scene, comprising:

illuminating said scene with an optical pulse, determining the intensity of light reflected by different portions of said scene by counting the number of photons received by a plurality of single photon avalanche diodes (SPADs) during a predefined period of time, or by measuring the time intervals between successive pulses determining the distance to different portions of said scene by counting the elapsed time between the emission of each pulse and reception of the corresponding reflected photons.

The method of the invention preferably comprises the following steps:

capturing a representation of a scene with an imaging circuit, said representation including a 2D brightness map of said scene as well as depth indication for indicating the distance to some portions of said scene, automatically isolating areas of said 2D brightness map based on said depth indication, separately processing said isolated areas.

BRIEF DESCRIPTION OF THE DRAWINGS

The invention will be better understood with the aid of the description of an embodiment given by way of example and illustrated by the figures.

DETAILED DESCRIPTION OF PREFERRED EMBODIMENTS

Figure 1:
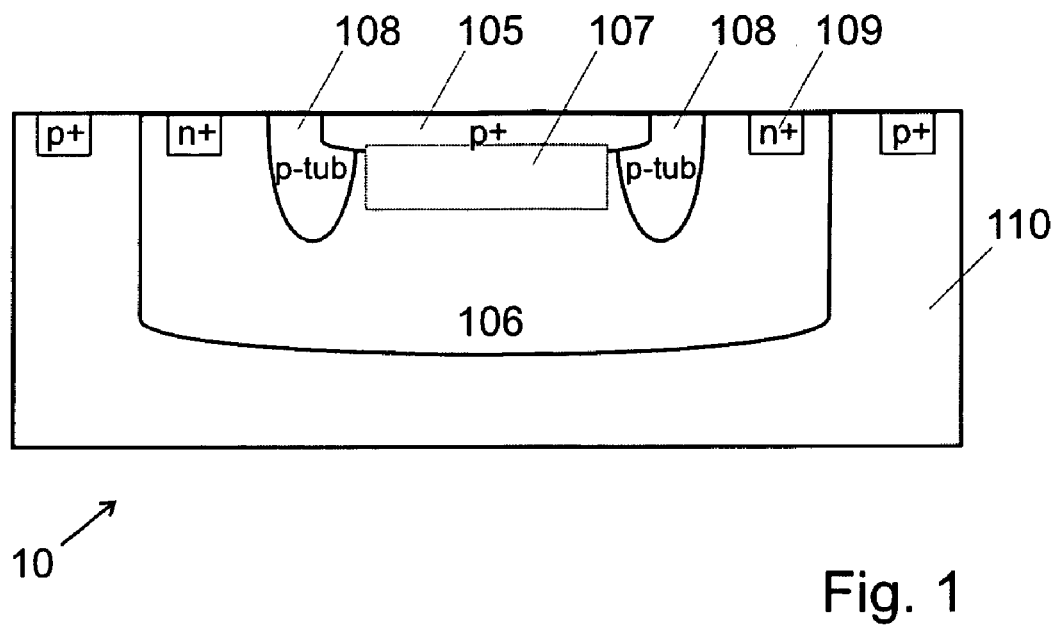
Figure 3:
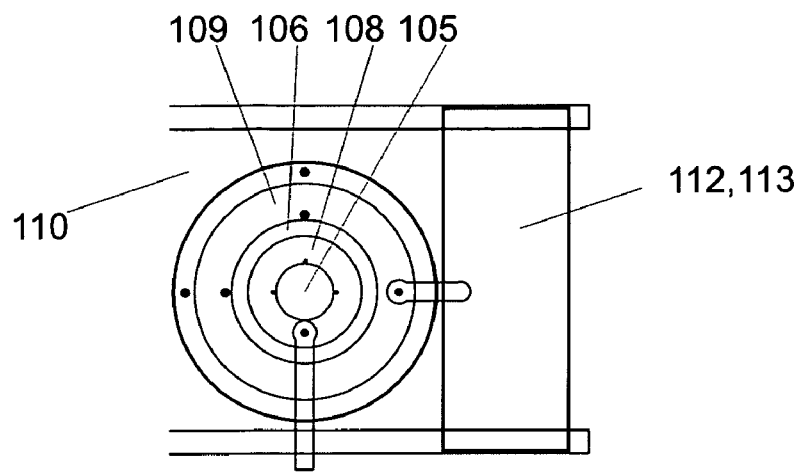

FIGS. 1 and 3 illustrate a CMOS implemented SPAD according to the invention. A SPAD is a p-n junction biased above breakdown voltage $V_{bd}$ by an excess voltage $V_e$ of a few volts. Operated in the so-called Geiger mode, avalanche photodiodes can react on single photons. A primary carrier resulting from the absorption of a photon may generate a nearly-infinite number of secondary electron-hole pairs by impact ionization.

The SPAD illustrated in FIG. 1 comprises a p/n junction 107 between a p+ region 105 (anode) and a deep n tub (n well) 106. A second junction exists between the deep n tub and the p substrate 110. The depth of those junctions and the doping profile of the different regions may be adapted to the wavelength one wants to detect.

The upper p+/deep n-tub junction 107 provides the multiplication region where the Geiger breakdown (the avalanche) occurs, regularly triggered by photons, possibly by simple photons For a SPAD to operate in avalanche mode, the upper p+/deep n tub of the junction must be protected against premature breakdown. This is achieved in this example with a guard ring 108. A useful feature of current CMOS technologies is the availability of a p-tub implantation to create a ring surrounding the p+ region 105. The breakdown voltage $V_{bd}$ forms in the central section of the p+/deep n-tub junction. A larger bias voltage $V_{bd}$+Ve must be applied on the diode to operate in single photon detection mode.

An integrated annular metal mask (not shown) may be provided, designed to cover the guard ring 108 and to leave a central aperture with a well defined diameter above each p+ anode. The diameter of the circular SPAD, respectively of the aperture in the metal mask, may be less than 10 µm, possibly 7 µm, depending on the technology.

Figure 2:
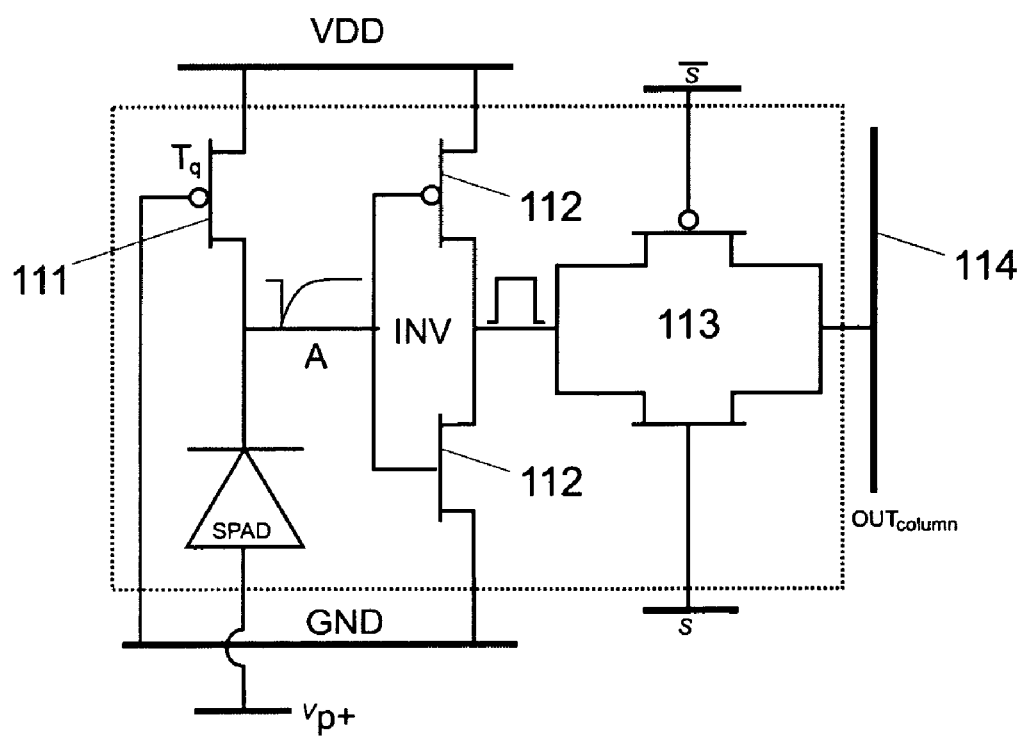

The pixel may comprise a circular SPAD as shown in FIG. 3 and, in the illustrated embodiment, an associated 5T-electronic circuit (5 CMOS transistors) as shown in FIG. 2. The SPAD may operate in passive or active quenching modes. Different implementation complexities result in power/area trade-offs. The deep n-tub cathode is connected to the power supply VDD through a long channel p-mos transistor $T_q$ acting as a quenching resistor 111 beneath each SPAD. The excess bias voltage is thus equal to $|V_p|++V_{DD-Vbd}$.

Upon photon arrival, the breakdown current discharges the depletion region capacitance, reducing the voltage across the junction 107 of the SPAD 10 to its breakdown voltage. The aspect ratio of $T_q$ is set in order to provide a sufficiently resistive path to quench the avalanche breakdown. After avalanche quenching, the SPAD recharges through $T_q$ and progressively recovers its photon detection capability.

The time required to quench the avalanche and restore the operating voltage is known as the dead time. At node A, an analog Geiger pulse of amplitude $V_e$ reflects the detection of a single photon. The circuit 112, here an inverter stage, converts this Geiger pulse into a digital pulse. The two transistor aspect ratios of the inverter 112 are designed to set the input to a certain threshold voltage. Other types or logic circuit, including comparators, may be used instead of an inverter for producing a digital pulse reflecting the output of the SPAD.

The optional transmission gate 113 feeds the detection signal to the column output line 114 when s=VDD and s=GND (read phase). This gate may be omitted, for example in embodiments where pixels are read in a non sequential order. The pixel outputs a digital signal at output 114 reflecting a photon arrival with picosecond precision. The near-infinite internal gain inherent to Geiger mode operation leads to no further amplification and the pixel output can be routed directly outside the chip.

Figure 4:
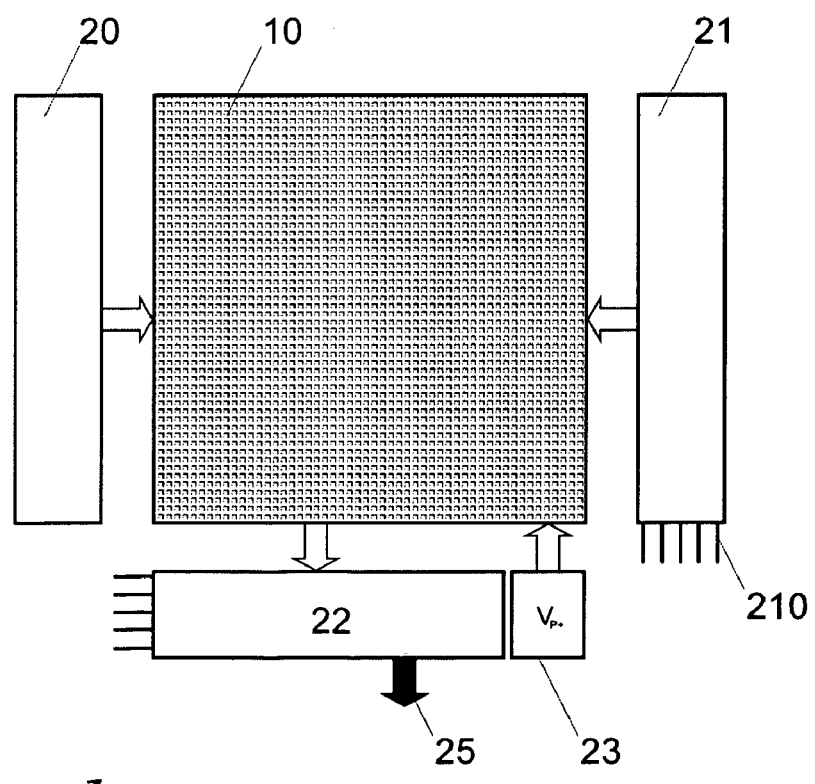

The functional diagram of a possible embodiment of the complete sensor is shown in FIG. 4. The SPAD array uses two power supply buses VDD supplied by a power supply 20 and $V_{p+}$, supplied by the element 23.

The readout circuitry preferably comprises a digital decoder 21 for row selection, using row selection signals 210, and a digital multiplexer 22 for column selection. The digital output 25 of the output multiplexer 25 is the 2D and/or 3D image signal delivered by the array.

The array may comprise tens, hundreds or even thousands or rows and/or columns. Embodiments with a single row, a single column, and/or only a few rows or columns are also possible.

In 3D imaging picosecond timing precision is required. Timing jitter reflects the statistical fluctuations of the time interval between the arrival of the photon at the sensor and the detection output pulse leading edge. In a SPAD, the timing jitter mainly depends on the time it takes for a photogenerated carrier to be swept out of the absorption zone into the multiplication region. The micrometric thickness of the depletion region inherent to the CMOS fabrication process leads to a remarkable timing jitter at preferably less than 50 ps FWHM.

In a SPAD, thermal and tunneling generation effects produce pulses even in the absence of illumination. These pulses define the dark count rate (DCR) of the detector, which includes primary and secondary counts. Primary dark counts are due to carriers thermally generated or tunneling generated in the depletion region. Secondary dark counts are due to afterpulsing effects. During an avalanche breakdown, some carriers may be captured by deep levels in the forbidden band and subsequently released with a probability to re-trigger an avalanche.

Figure 5:
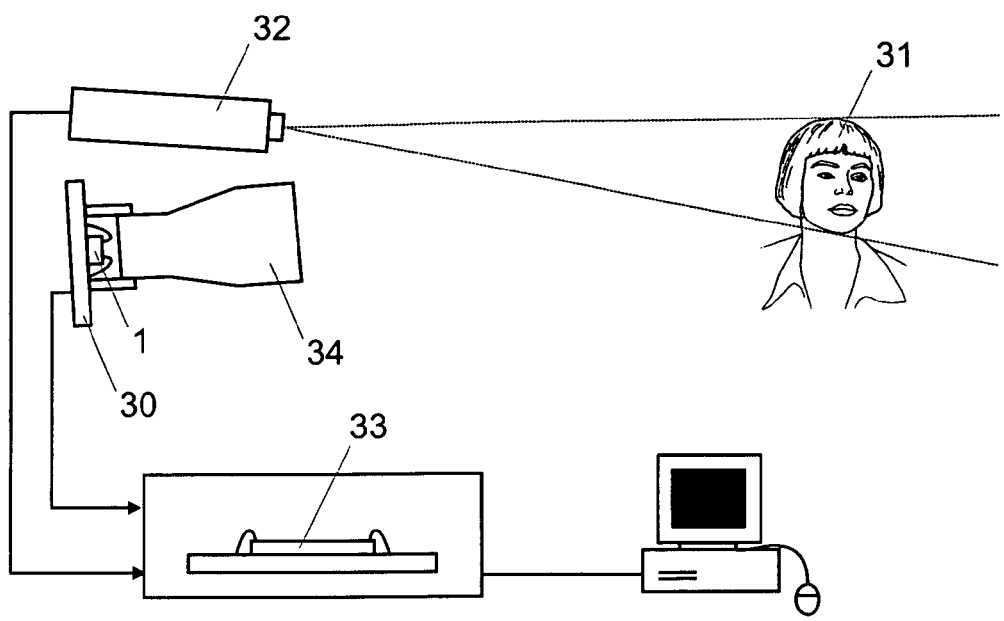

A possible electro-optical setup is described in FIG. 5. The CMOS sensor (imager) 1 may be mounted on a printed circuit board 30 and equipped with a standard imaging lens 34.

The target 31 is hit by uncollimated light generated by a pulsed laser source 32. The source is pulsed at a given repetition rate fR, for example 50 MHz, with a given pulse length $T_P$, e.g. 150 ps, and peak power $P_s$, e.g. 100 mW. A time-to-digital converter (TDC) 33 is used for depth measurement using TOF. The START signal of the TDC is given by the synchronization output of the laser, the STOP signal by the digital output of the SPAD array. The TDC, implemented in a standard CMOS technology, exhibits a timing resolution in the order of tens of picoseconds and a comparable timing uncertainty. The TDC may also be implemented on the same monolithic array than the SPADS. The signal delivered by the TDC may be delivered to a digital processing unit implemented on chip or an external one, for example a personal computer,. a microprocessor, etc.

A readout circuit of 2D pixels (not shown on the Figure) may use asynchronous counters for counting the number of photons received by each SPAD during a predetermined period of time. The start and the end of the period may be given by a clock, possibly synchronized with an external quartz element. Duration of the counting period is typically larger than the average measured time of flight, in order to count several photons after the first one has been received. It is also possible to count pulses generated by several successive light pulses and/or by several adjacent SPADs.

Figure 6:
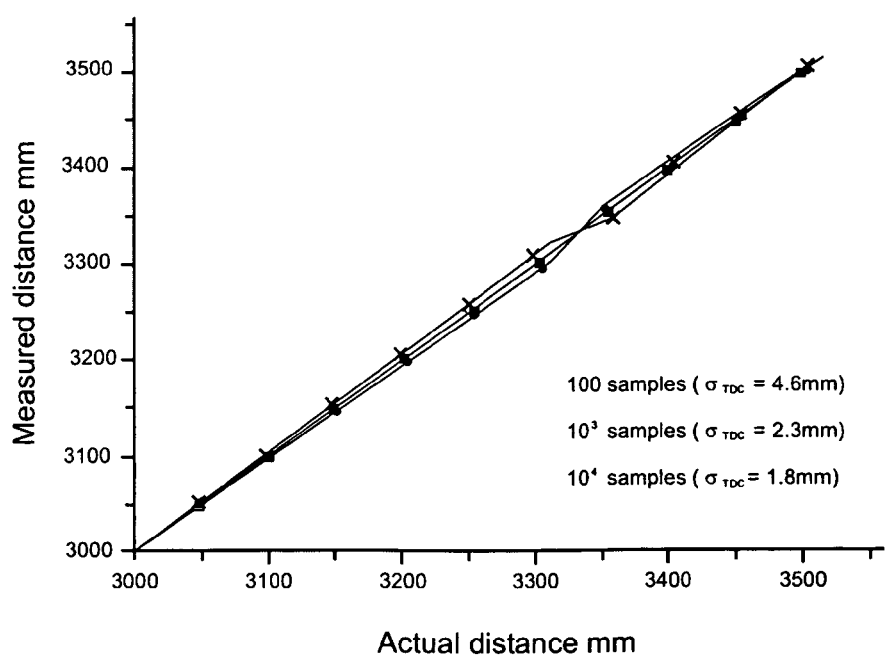

The total timing uncertainty σ(T) may be dominated by the TDC precision, illumination pulse duration and the skews of non-uniform pixel-to-TDC propagation paths. To reach millimetric precision a statistical metrological approach is adopted, whereby a number M of measurements were averaged over the integration period. FIG. 6 shows multiple depth measurements with M=100, $10^3$, and $10^4$ at and around 3.5 m distance. The 1-σ uncertainty is also reported.

Figure 7:

Next, the depth map of a live-sized human model was captured. FIG. 7 shows a high-resolution picture of the model. To demonstrate the actual pixel resolution, an intensity map of the model, obtained with the camera operating in 2D mode, is also shown in the figure.

Figure 8:
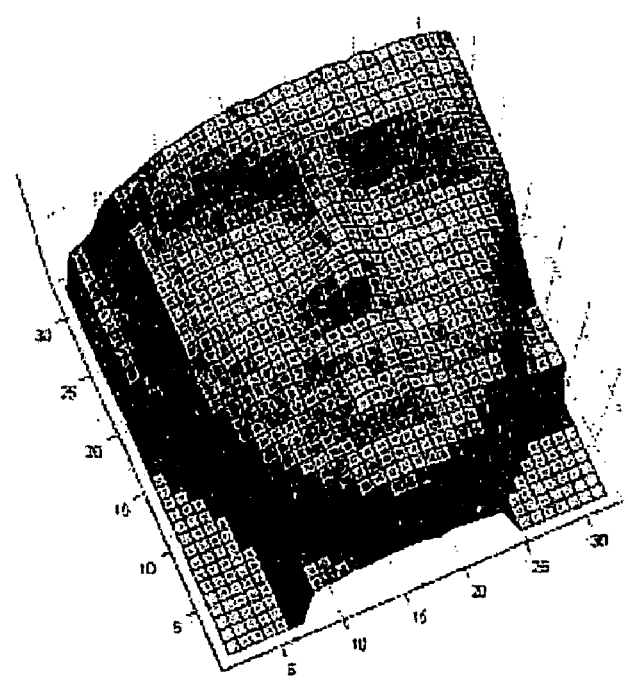

FIG. 8 shows the depth map of the model's face. The model was placed in front of a plane reference at 3 m from the sensor. The image was obtained by using the same light source parameters of the above experiments with $M=10^4$.

Figure 9:
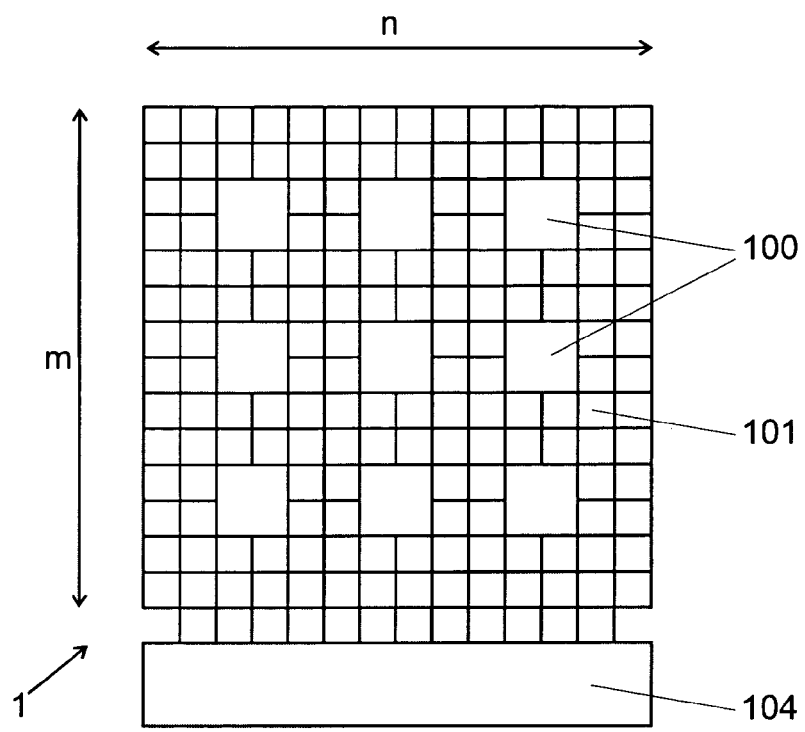

FIG. 9 shows an embodiment of an imager circuit 1 comprising an array of m rows of 2D pixel and n columns of 2D pixels. Each 2D pixel 101 is made up of a single photon avalanche diode and an associated 2D readout circuit, which is totally or at least partially located on the same substrate. 2D pixels are adjacents. In the illustrated example, the 2D readout circuits 104 are located on the same substrate as the SPADs, but outside of the array. In another embodiment, at least some components of the readout circuits could be mounted in direct vicinity of the associated pixels. Each 2D readout circuit preferably comprises an asynchronous digital counter for counting the number of pulses produced by the associated SPAD during a predetermined period of time after emission of the optical pulse. The output of the counter corresponds to the number of photons reflected by the corresponding portion of the scene, and thus indicates its brightness.

The imager circuit of FIG. 9 further comprises a number of discrete, non adjacent, 3D pixels 100 spread into the array of 2D pixels. The surface of the 3D pixels is larger than the surface of the 2D pixels, so that the 3D pixels are viewed as discontinuities in the otherwise regular array of 2D pixels. Interpolation hardware and/or software may be used to compensate for those discontinuities in the brightness map. In another embodiment, 3D SPADs may be placed outside the regular m×n array of 2D SPADs, but on the same chip. Each 3D pixel comprises a single photon avalanche diode coupled to an associated 3D readout circuit, which is totally or at least partially located on the same substrate. In the illustrated example, the 3D readout circuits 104 are located with the 2D circuits, on the same substrate than the SPADs, but outside the array. In another embodiment, at least some components of the readout circuits could be mounted in the direct vicinity of the associated pixels. Each 3D readout circuit preferably comprises a time-to-digital converter (TDC) to determine the distance to said scene by determining the elapsed time between the emission of each pulse and reception of the corresponding reflected photons. The digital value determined by each TDC thus indicates the time of flight of the photon, and can be used for determining the distance between the circuit and the corresponding portion of the scene.

The circuit of FIG. 9 can be used for determining a brightness map with a first, high resolution and a depth map with a lower resolution. Depth determination can be used for example in order to control the focus of the optical system on the optical path between the scene and the circuit, or to give supplementary indications about the distance to portions of the scene; this additional information can be used for example by an image processing program for automatically isolating areas of said 2D brightness map based on said depth indication, and separately processing said isolated areas. The 3 dimensional information delivered by the 3D SPADS thus allows a more precise extraction of parts of 2D image at different distances from the sensor. Other essentially 2D image processing functions may use the 3D information delivered by the circuit, including background or foreground extraction, sharpness increase, illumination correction, correction of geometrical and/or optical deformations, and image data compression, among others.

Figure 10:
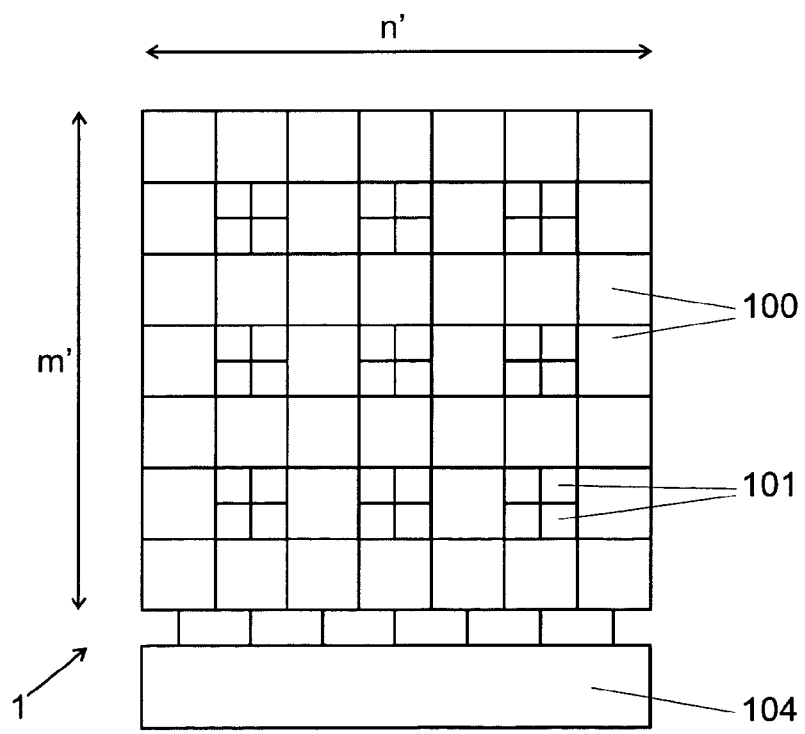

FIG. 10 illustrates another embodiment of circuit comprising an array of m' rows and n' columns of 3D pixels. The circuit of FIG. 10 further comprises a number of smaller discrete, non adjacent, 2D pixels 101 spread into the array of 3D pixels. This circuit may thus be used to produce a depth map with a first resolution and a brightness map with a second, lower resolution. Brightness data can be used to prevent saturation of the 3D pixels when ambient light is too bright, for example by controlling a diaphragm, and/or for improving and completing a 3D representation of a scene.

In another embodiment, at least one SPAD pixel is connected simultaneously to a 2D readout circuit and to a 3D readout circuit for determining both the brightness and the depth of a scene's portion. Brightness and depth may be measured simultaneously, i.e. using the same optical pulse, or at different times.

The present invention also relates to embodiments in which all CMOS SPADS are connected to a 2D readout circuit and to a different 3D readout circuit, or to a common 2D and 3D readout circuit, or to a 3D readout circuit only.

The present invention also relates to still and/or animated image data storage formats allowing storage of depth, in addition to brightness and color, whereas the depth resolution may be the same or different than the resolution used for brightness or colors.

Moreover, the one skilled in the art will understand that the circuit of the invention may also use 2D readout circuit based on other elements than counter, including 2D readout circuit continuously integrating the output of said SPADs. Similarly, 3D readout circuits may be based on other elements than TDC for determining the length of the optical path between the scene and the sensor.

The invention claimed is:

1. An integrated imager circuit comprising a monolithic array of single photon avalanche diodes (SPADs) for capturing an image of a scene when said scene is hit by an optical pulse, said array comprising:
   a plurality of first SPADs connected to 2D readout circuits to determine the intensity of the light reflected by said scene by counting the number of photons received by said SPADs during a period of time or by measuring the mean time interval between successive pulses,
   a plurality of second SPADs connected to 3D readout circuits to determine the distance to said scene by determining the elapsed time between the emission of each pulse and reception of the corresponding reflected photons.

2. The circuit of claim 1, wherein said SPADs are CMOS-implemented and operated in the Geiger mode.

3. The circuit of claim 2, wherein said 2D readout circuits comprise digital counters for counting the number of pulses at the output of the SPADs during a period of time, said digital counter being integrated in said circuit.

4. The circuit of claim 3, wherein said 3D readout circuits comprise time-to-digital converters (TDC) integrated in said circuit.

5. The circuit of claim 1, comprising a plurality of mutually adjacent first SPADs connected to 2D readout circuits and several non adjacent second SPADs connected to 3D readout circuits spread into said array.

6. The circuit of one of claim 1, comprising a plurality of mutually adjacent second SPADs connected to 3D readout circuits and several non adjacent SPADs connected to 2D readout circuits spread into said array.

7. The circuit of claim 1, comprising at least one SPAD connected to a 2D and 3D readout circuit arranged so as to determine both the intensity of light reflected by a scene and the distance to said scene.

8. The circuit of claim 1, said first SPADs being distinct from said second SPADs.

9. The circuit of claim 8, the surface of said first SPADs being different from the surface of said second SPADs.

10. The circuit of claim 1, each 2D readout circuit being located in said array in immediate vicinity of the corresponding first SPADs, each 3D readout circuit being located in said array in immediate vicinity of the corresponding second SPADs.

11. The circuit of one of claim 1, arranged so as to capture a 2D image and a 3D image having different resolutions.

12. An imaging system comprising:
the circuit of claim 1,
data processing means for computing a representation of the scene captured by said circuit, said representation depending both on the intensity of the light reflected by different portions of the scene and on the distance between said circuit and other portions of said scene.

13. An imaging system comprising:
the circuit of claim 1,
an optical system on the optical path between said circuit and said scene,
wherein the control of focus by said optical system depends on said 3D readout circuit.

14. A method for capturing and processing a digital 2D picture, comprising:
capturing a representation of said scene with the circuit of claim 1, said representation including a 2D brightness map of said scene as well as depth indication for indicating the distance to some portions of said scene,
automatically isolating areas of said 2D brightness map based on said depth indication,
separately processing said isolated areas.

15. A method for capturing an image of a scene, comprising:
illuminating said scene with an optical pulse,
determining the intensity of light reflected by different portions of said scene by counting the number of photons received by a first plurality of single photon avalanche diodes (SPADs) during a period of time, or by measuring the time intervals between successive pulses
determining by a second plurality of SPADs the distance to different portions of said scene by counting the elapsed time between the emission of each pulse and reception of the corresponding reflected photons, wherein said first and second plurality of SPADs are in a monolithic array.

16. A circuit comprising a monolithic array of single photon avalanche diodes (SPADs) operating in the Geiger mode for capturing an image of a scene, said array comprising:
a plurality of first SPADs associated with counting means for counting the number of optical pulses at the output of the first SPADs, so as to determine the brightness,
a plurality of second SPADs associated with means for determining the elapsed time between the emission of each optical pulse and reception of the corresponding reflected photons.

17. A monolithic integrated circuit comprising:
an array of CMOS implemented single photon avalanche diodes (SPADs),
a plurality of 2D readout circuits to determine the intensity of light received by at least some of said SPADs,
a plurality of 3D readout circuits to determine the elapsed time between emission and reception of the optical pulses by at least some of said SPADs.

* * * * *